United States Patent
Chen et al.

(10) Patent No.: US 10,466,732 B2
(45) Date of Patent: Nov. 5, 2019

(54) SWITCHING REGULATOR AND CONTROL CIRCUIT AND CONTROL METHOD THEREOF

(71) Applicant: RICHTEK TECHNOLOGY CORPORATION, Zhubei, Hsinchu (TW)

(72) Inventors: Chien-Yu Chen, Hsinchu (TW); Tsung-Yi Huang, Hsinchu (TW); Ting-Wei Liao, Taichung (TW)

(73) Assignee: RICHTEK TECHNOLOGY CORPORATION, Zhubei, Hsinchu (TW)

( * ) Notice: Subject to any disclaimer, the term of this patent is extended or adjusted under 35 U.S.C. 154(b) by 0 days.

(21) Appl. No.: 16/274,162

(22) Filed: Feb. 12, 2019

(65) Prior Publication Data

US 2019/0302822 A1    Oct. 3, 2019

Related U.S. Application Data

(60) Provisional application No. 62/649,549, filed on Mar. 28, 2018.

(30) Foreign Application Priority Data

Dec. 13, 2018 (TW) .............................. 107144966 A

(51) Int. Cl.
*H02M 3/156* (2006.01)
*H02H 9/04* (2006.01)
(Continued)

(52) U.S. Cl.
CPC ............. *G05F 3/227* (2013.01); *H02H 9/048* (2013.01); *H02M 3/156* (2013.01); *H03K 17/223* (2013.01); *H03K 19/00315* (2013.01)

(58) Field of Classification Search
CPC . H02M 2001/0003; H02M 2001/0009; H02M 2001/0051; H02M 2001/0048;
(Continued)

(56) References Cited

U.S. PATENT DOCUMENTS

| 4,871,927 A * | 10/1989 | Dallavalle | ........ H03K 19/00315 327/546 |
| 6,522,512 B1 * | 2/2003 | Kamiya | ........... H03K 19/00315 326/83 |

(Continued)

*Primary Examiner* — Adolf D Berhane
*Assistant Examiner* — Shahzeb K Ahmad
(74) *Attorney, Agent, or Firm* — Tung & Associates

(57) ABSTRACT

A switching regulator includes a power stage circuit and a control circuit. The power stage circuit operates a high-side switch and a low-side switch therein according to a high-side signal and a low-side signal respectively to generate an inductor current flowing through an inductor therein. The adjustment signal generation circuit in the control circuit generates an adjustment level according to the high-side signal, the low-side signal, and/or the inductor current, wherein the adjustment level is switched between a reverse recovery level and an anti-latch-up level, and is electrically connected to a low-side isolation region of the low-side switch. The reverse recovery level is lower than the input voltage. The anti-latch-up level is higher than the reverse recovery level to avoid a latch-up effect.

21 Claims, 11 Drawing Sheets

(51) Int. Cl.
*G05F 3/22* (2006.01)
*H03K 19/003* (2006.01)
*H03K 17/22* (2006.01)

(58) Field of Classification Search
CPC ...... H02M 3/156; H02M 3/157; H02M 3/158; H02M 3/1582; H02M 1/32; H02H 9/048; G05F 3/227; H03K 19/00315; H03K 17/223

See application file for complete search history.

(56) References Cited

U.S. PATENT DOCUMENTS

| | | | | |
|---|---|---|---|---|
| 2010/0301827 | A1* | 12/2010 | Chen | H02M 3/156 |
| | | | | 323/299 |
| 2011/0241634 | A1* | 10/2011 | Kenly | H02M 3/156 |
| | | | | 323/271 |
| 2015/0364470 | A1* | 12/2015 | Yamaji | H01L 27/0921 |
| | | | | 257/372 |
| 2017/0358570 | A1* | 12/2017 | Taghizadeh Kaschani | |
| | | | | H01L 29/0623 |
| 2018/0294723 | A1* | 10/2018 | Dalena | H02M 3/1563 |

* cited by examiner

SWITCHING REGULATOR AND CONTROL CIRCUIT AND CONTROL METHOD THEREOF

CROSS REFERENCE

The present invention claims priority to U.S. 62/649,549, filed on Mar. 28, 2018, and TW 107144966, filed on Dec. 13, 2018.

BACKGROUND OF THE INVENTION

Field of Invention

The present invention relates to a switching regulator and a control circuit and a control method thereof; particularly, it relates to such a switching regulator which is capable of avoiding parasitic transistor latch-up effect and reducing reverse recovery time, and a control circuit and a control method thereof.

Description of Related Art

FIG. 1A shows a schematic diagram of a typical switching regulator 10. The switching regulator 10 includes a control circuit 11 and a power stage circuit 12. The power stage circuit 12 has a high-side switch 121 and a low-side switch 122 as shown in the figure. The high-side switch 121 and the low-side switch 122 operate according to a high-side signal UG and a low-side signal LG respectively, to convert an input voltage Vin to an output voltage Vout, and to generate an inductor current IL flowing through an inductor 123 in the power stage circuit 12.

FIG. 1B shows a schematic diagram of signal waveforms of the switching regulator 10 when a load circuit 14 is in a light load condition. "Light load" is a relative term indicating a condition consuming significantly less power than a full load condition. In general, the light load condition consumes power less than 30% of the full load condition. In the present invention, "light load" also indicates a condition which will cause the inductor current IL to ring around zero current level (0 A).

As shown in FIG. 1B, in order to ensure that the ON-time of the high-side switch 121 and the ON-time of the low-side switch 122 do not overlap with each other, after the high-side signal UG transits from the high-side high level UGH to the high-side low level UGL, there is a dead time DT1 before the low-side signal LG transits from the low-side low level LGL to the low-side high level LGH; and after the low-side signal LG transits from the low-side high level UGH to the low-side low level LGL, there is a dead time DT2 before the high-side signal UG transits from the high-side low level UGL to the high-side high level UGH. Note that, the high-side switch 121 is coupled between the input voltage Vin and a phase node PH, and the low-side switch 122 is coupled between the phase node PH and a ground level GND, so the high-side high level UGH and the low-side high level LGH are different voltage levels with reference to the ground level GND, and the high-side low level UGL and the low-side low level LGL are also different voltage levels with reference to the ground level GND.

Still referring to FIG. 1B, due to continuity of the current flowing through the inductor, in the first dead time DT1, although the low-side switch 122 is not ON, the parasitic diode LD in the low-side switch 122 is conductive, so the phase node voltage LX of the phase node PH is lower than the ground level GND by a forward voltage of the parasitic diode LD; and in the second dead time DT2, although the high-side switch 121 is not ON, the parasitic diode UD of the high-side switch 121 is conductive, so the phase node voltage LX is higher than the input voltage Vin by a forward voltage of the parasitic diode UD.

As shown in FIG. 1B, in the second dead time DT2, when the inductor current IL is a negative current lower than the zero current level, a parasitic transistor PNP in the high-side switch 121 and a parasitic transistor NPN in the low-side switch 122 are turned ON. Because the aforementioned PNP transistor and the NPN transistor are electrically connected to each other, a latch-up effect occurs which may damage the switching regulator 10.

In view of above, to overcome the drawbacks in the prior art, the present invention proposes a switching regulator and a control circuit and a control method thereof, to avoid the parasitic transistor latch-up effect and to reduce the reverse recovery time.

SUMMARY OF THE INVENTION

From one perspective, the present invention provides a switching regulator, configured to operably convert an input voltage to an output voltage, and comprising: a power stage circuit including a high-side switch, a low-side switch, and an inductor coupled with one another, the power stage circuit being configured to operably convert the input voltage to the output voltage by operating the high-side switch and the low-side switch according to a high-side signal and a low-side signal respectively, and generate an inductor current flowing through the inductor; and a control circuit, which is coupled to the power stage circuit, and includes: a switching signal generation circuit, which is coupled to the power stage circuit, and is configured to operably generate the high-side signal and the low-side signal according to a command signal; and an adjustment signal generation circuit, which is coupled to the power stage circuit and the switching signal generation circuit, and is configured to operably provide an adjustment level according to the high-side signal, the low-side signal, and/or the inductor current, wherein the adjustment level is electrically connected to an isolation region of the low-side switch; wherein the adjustment level is switched between a reverse recovery level and an anti-latch-up level; wherein the reverse recovery level is lower than the input voltage; wherein the anti-latch-up level is higher than the reverse recovery level to avoid a latch-up effect.

From another perspective, the present invention provides a control circuit of a switching regulator, wherein the switching regulator is configured to operably convert an input voltage to an output voltage, and include: a power stage circuit including a high-side switch, a low-side switch, and an inductor coupled with one another, the power stage circuit being configured to operably convert the input voltage to the output voltage by operating the high-side switch and the low-side switch according to a high-side signal and a low-side signal respectively, and generate an inductor current flowing through the inductor; and the control circuit, which is coupled to the power stage circuit, and the control circuit includes: a switching signal generation circuit, which is coupled to the power stage circuit, and is configured to operably generate the high-side signal and the low-side signal according to a command signal; and an adjustment signal generation circuit, which is coupled to the power stage circuit and the switching signal generation circuit, and is configured to operably provide an adjustment level according to the high-side signal, the low-side signal, and/or the inductor current, wherein the adjustment level is electrically connected to an isolation region of the low-side switch; wherein the adjustment level is switched between a reverse recovery level and an anti-latch-up level; wherein the reverse recovery level is lower than the input voltage; wherein the anti-latch-up level is higher than the reverse recovery level to avoid a latch-up effect.

From another perspective, the present invention provides a control method of a switching regulator, comprising: generating a high-side signal and a low-side signal according to a command signal; operating a high-side switch and a low-side switch in a power stage circuit according to a high-side signal and a low-side signal respectively to convert an input voltage to an output voltage, and generating an inductor current flowing through an inductor in the power stage circuit, wherein the high-side switch, the low-side switch, and the inductor are coupled with one another; and providing an adjustment level according to the high-side signal, the low-side signal, and/or the inductor current, wherein the adjustment level is electrically connected to an isolation region of the low-side switch; wherein the adjustment level is switched between a reverse recovery level and an anti-latch-up level; wherein the reverse recovery level is lower than the input voltage; wherein the anti-latch-up level is higher than the reverse recovery level to avoid a latch-up effect.

In one preferable embodiment, the adjustment level is at the reverse recovery level in a reverse recovery time right after a first dead time, and is at the anti-latch-up level in a second dead time, wherein the first dead time is from when the high-side signal transits to a high-side inactive level to when the low-side signal transits to a low-side inactive level, and the second dead time is from when the low-side signal transits to a low-side inactive level to when the high-side signal transits to a high-side active level.

In one preferable embodiment, the adjustment signal generation circuit includes a logic circuit configured to generate the adjustment level which is inverse to the low-side signal.

In one preferable embodiment, the adjustment signal generation circuit includes a logic circuit configured to generate the adjustment level according to the high-side signal and the low-side signal, wherein the adjustment level is at the anti-latch-up level in the first dead time and the second dead time, and is at the reverse recovery level in a period other than the first dead time and the second dead time.

In one preferable embodiment, the adjustment signal generation circuit includes: a negative current triggered clock generation circuit, configured to operably generate a negative current clock according to the inductor current, wherein the negative current clock signal is switched to an acknowledged level when the inductor current is a negative current; a determination circuit, which is coupled to the negative current clock generation circuit, and is configured to operably generate a determination signal according to the negative current clock signal and a reference signal; and a switching circuit, which is coupled to the determination circuit, and is configured to operably switch the adjustment level between the reverse recovery level and the anti-latch-up level according to the determination signal.

In one preferable embodiment, the determination circuit includes: a low-pass filter, which is coupled to the negative current triggered clock generation circuit, and is configured to operably generate a comparison signal according to a duty ratio of the acknowledged level; and a comparison circuit, which is coupled to the low-pass filter, and is configured to operably compare the comparison signal with the reference signal to generate the determination signal.

In one preferable embodiment, the reverse recovery level is a ground level or a low-side low level of the low-side signal, and the anti-latch-up level is a low-side high level of the low-side signal, a high-side high level of the high-side signal, the input voltage, or a phase voltage at a phase node among the high-side switch, the low-side switch and the inductor.

The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, to show the interrelations between the circuits, regions, and the signal waveforms, but not drawn according to actual scale.

Figure 1A:
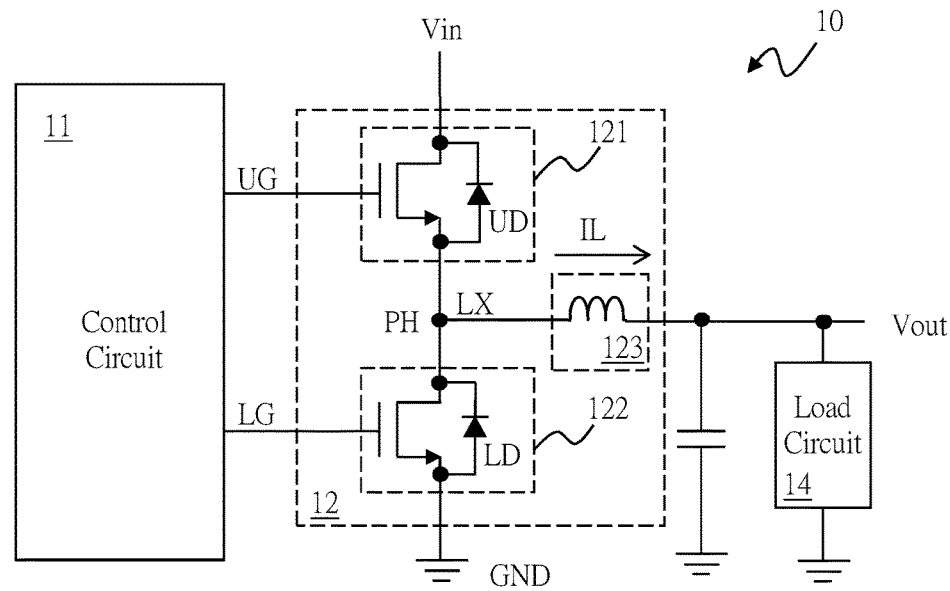
FIGS. 1A and 1B show schematic diagrams of a prior art switching regulator 10 and signal waveforms thereof, respectively.
Figure 1B:
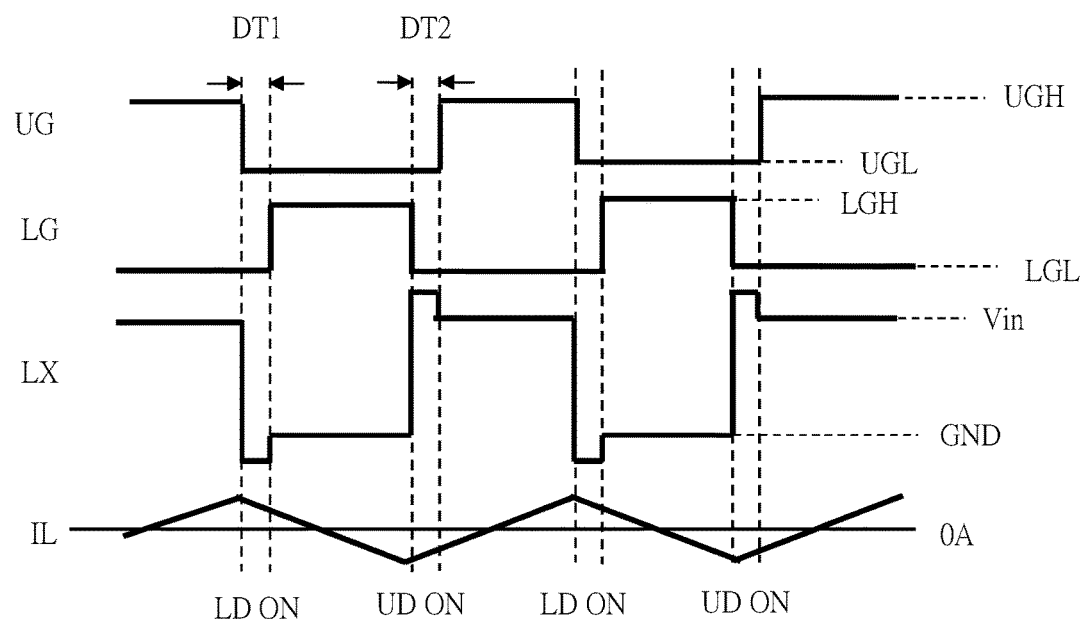
Figure 2A:
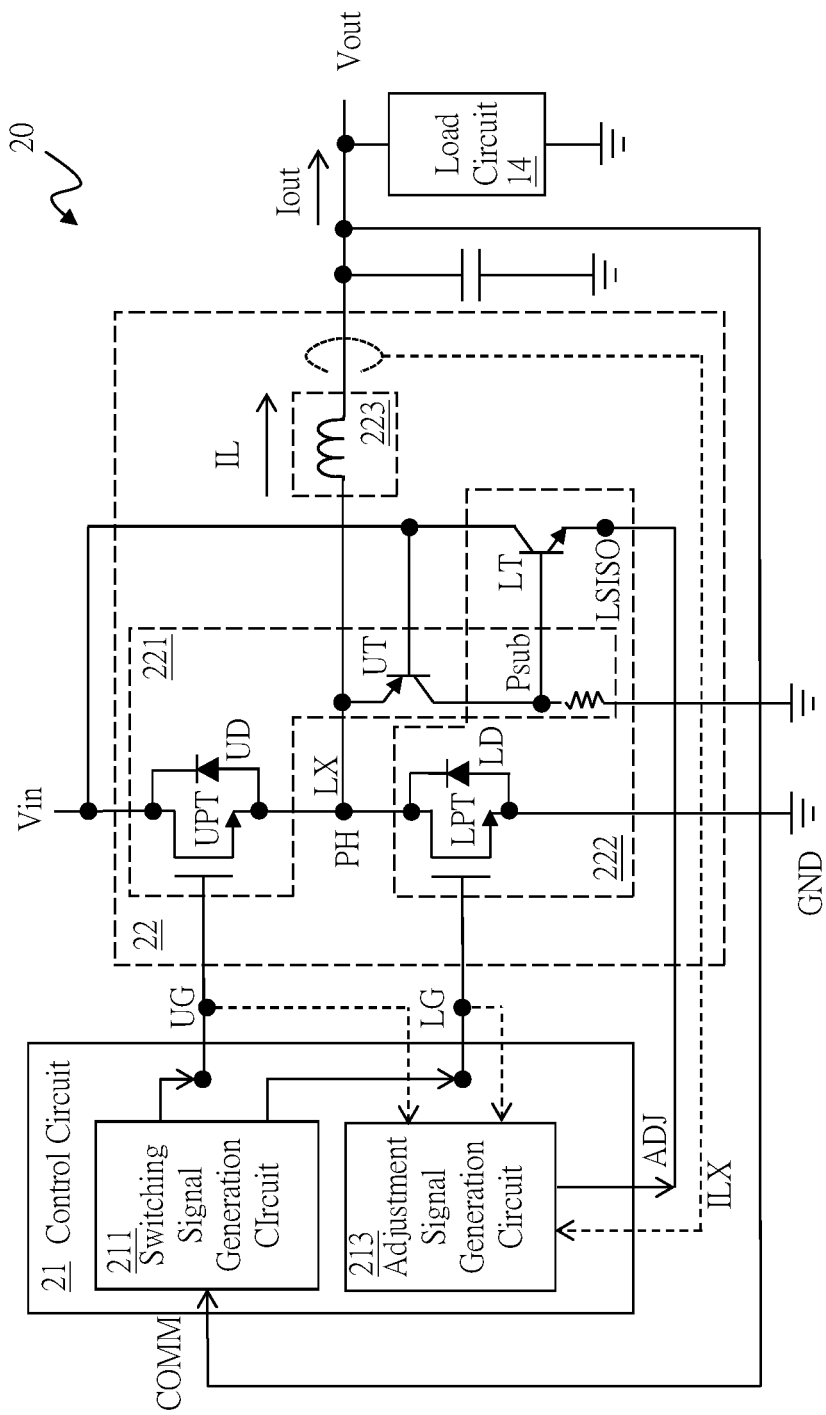
FIGS. 2A-2C show a first embodiment of the present invention.
Figure 2B:
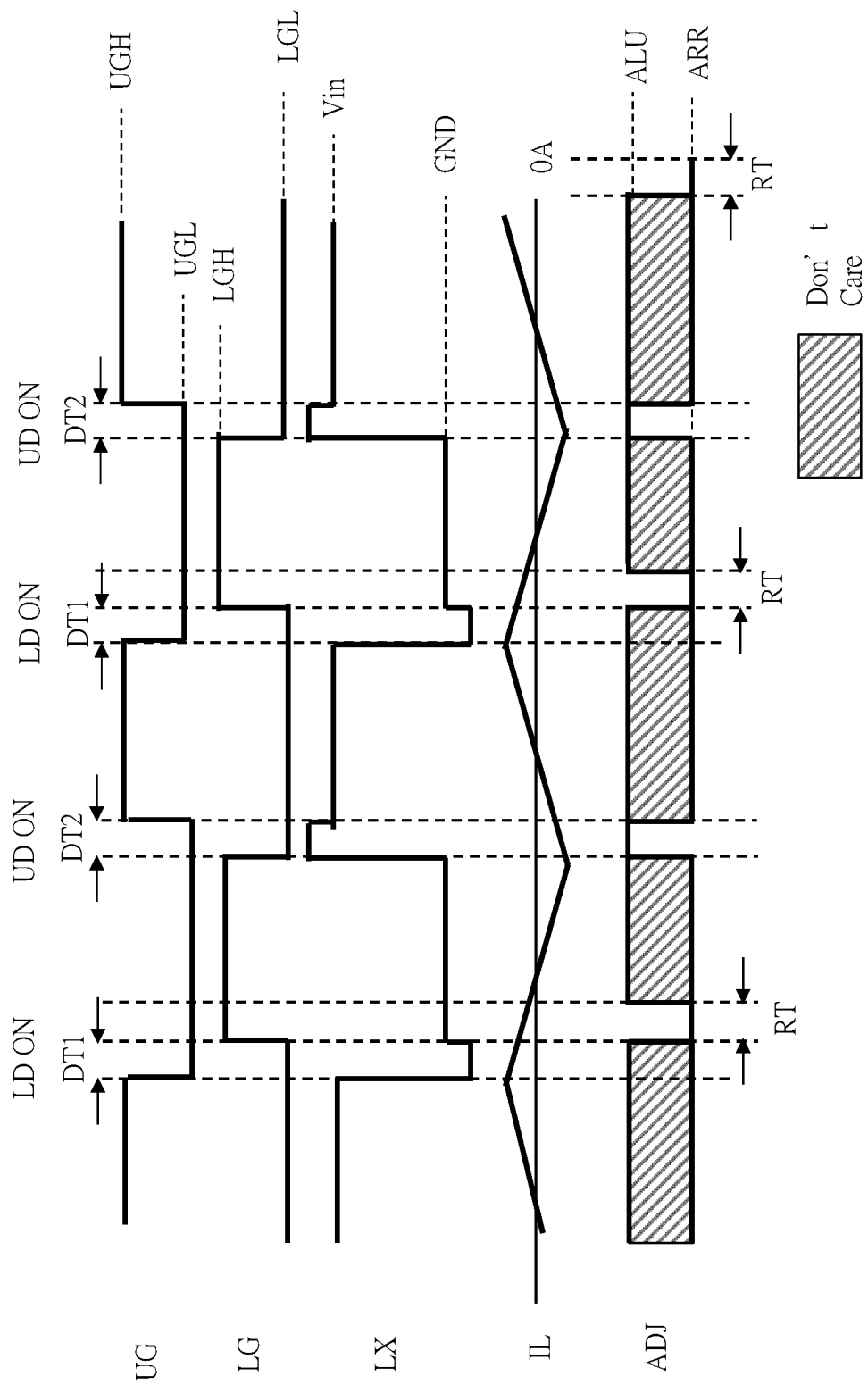
Figure 2C:
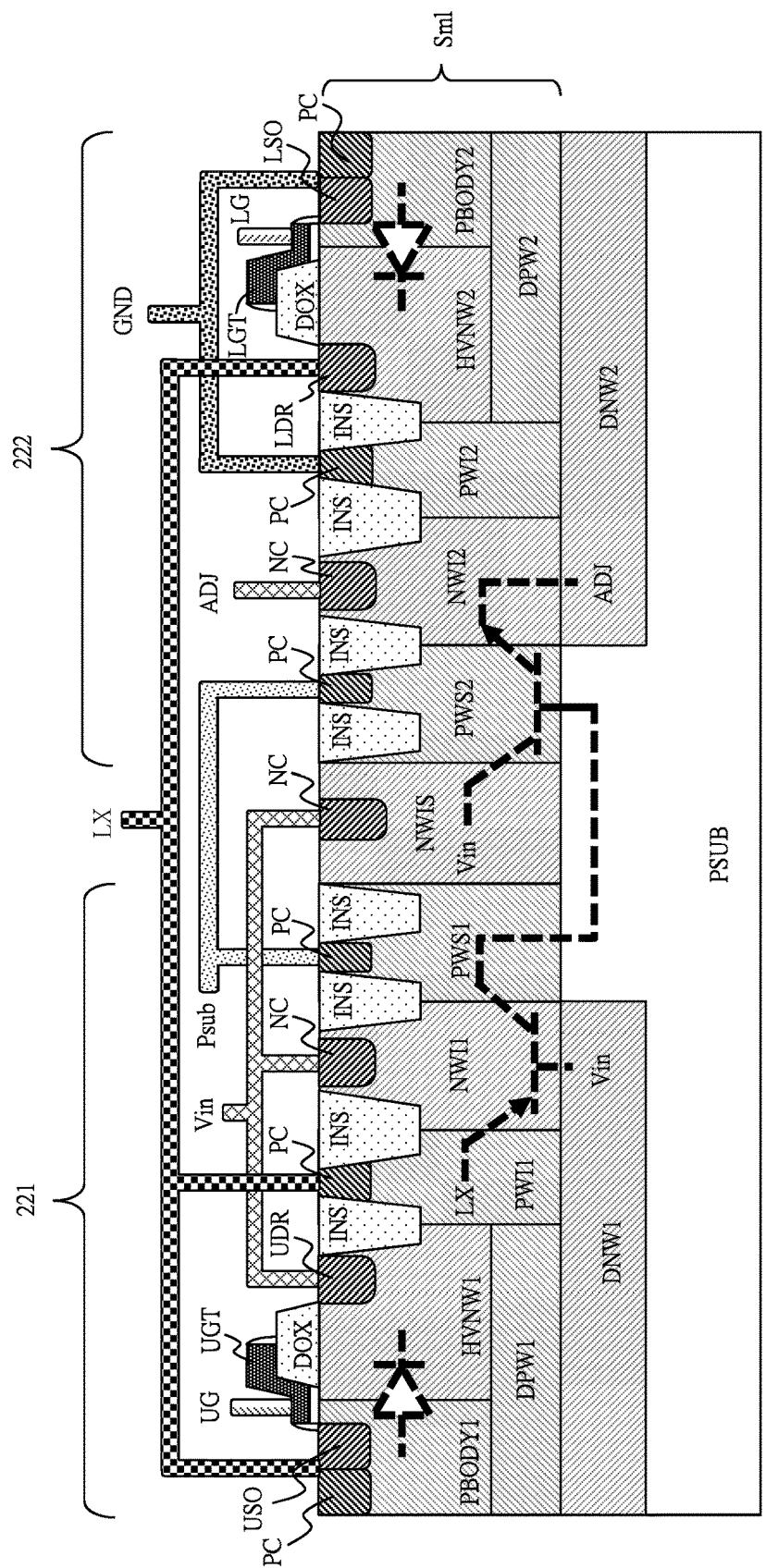
Figure 3A:
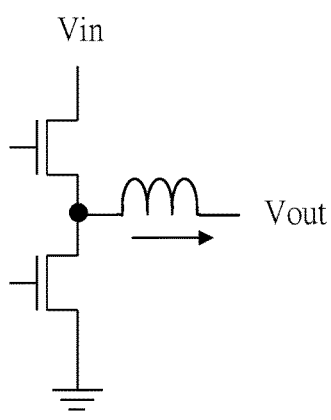
FIGS. 3A-3G show synchronous and asynchronous buck, boost, inverting, buck-boost, and inverting-boost power stage circuits.
Figure 3B:
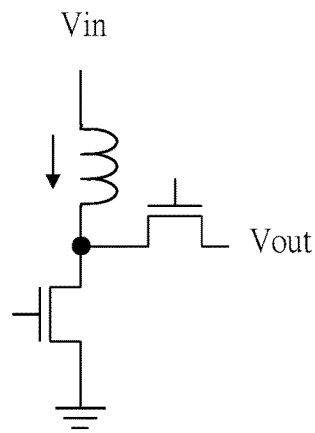
Figure 3C:
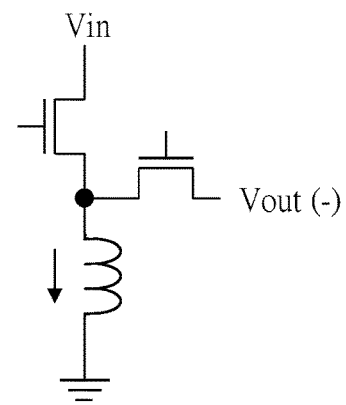
Figure 3D:
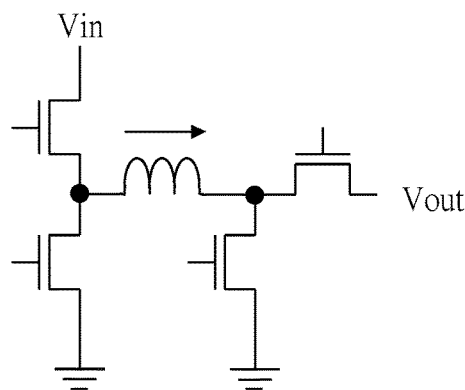
Figure 3E:
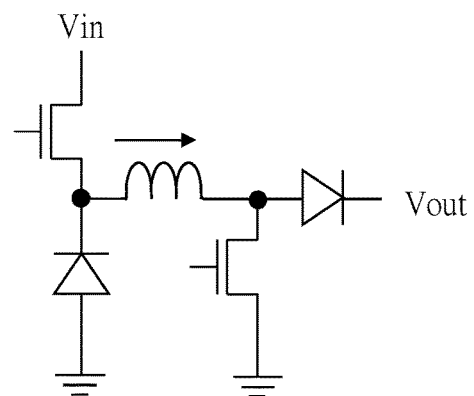
Figure 3F:
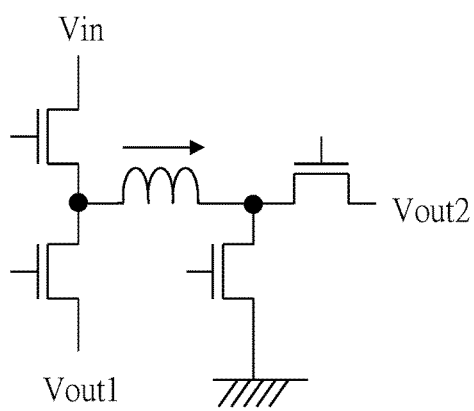
Figure 3G:
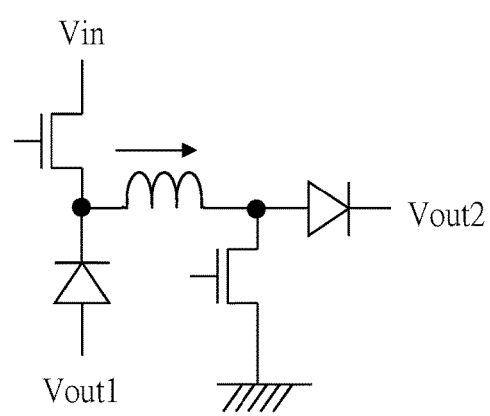

FIGS. 2A-2C show a first embodiment according to the present invention. FIG. 2A shows a schematic diagram of a switching regulator 20. As shown in FIG. 2A, the switching regulator 20 includes a control circuit 21 and a power stage circuit 22. The power stage circuit 22 operates a high-side switch 221 and a low-side switch 222 therein according to a high-side signal UG and a low-side signal LG respectively, to convert an input voltage Vin to an output voltage Vout, and to generate an inductor current IL flowing through an inductor 223 in the power stage circuit 22, wherein the output voltage Vout and the inductor current IL are provided to a load circuit 14. The power stage circuit 22 may be a synchronous or asynchronous buck, boost, inverting, buck-boost, or inverting-boost power stage circuit as shown in FIGS. 3A-3G.

Still referring to FIG. 2A, the control circuit 21 is coupled to the power stage circuit 22. The control circuit 21 includes: a switching signal generation circuit 211 and an adjustment signal generation circuit 213. The switching signal generation circuit 211 is coupled to the power stage circuit 22, and is configured to operably generate the high-side signal UG and the low-side signal LG according to a command signal COMM, to operate the high-side switch 221 and the low-side switch 222, so as to convert the input voltage Vin to the output voltage Vout. The command signal COMM is, in one embodiment, related to the output voltage Vout, as shown in FIG. 2A. Or, the command signal COMM may be related to a predetermined target of the output voltage Vout, a current flowing through the high-side switch 221, a current flowing through the low-side switch 222, or a combination of the aforementioned parameters (the output voltage Vout, the predetermined target, the current flowing through the high-side switch 221, and the current flowing through the low-side switch 222). The switching signal generation circuit 221 can operate the high-side switch 221 and the low-side switch 222 according to the command signal COMM, to regulate the output voltage Vout or an output current Iout to a (or the) predetermined target.

The adjustment signal generation circuit 213 is coupled to the power stage circuit 22 and the switching signal generation circuit 211, and is configured to operably provide an adjustment level ADJ according to the high-side signal UG, the low-side signal LG, and/or the inductor current IL (for example according to an inductor current related signal ILX), wherein the adjustment level ADJ is electrically connected to an isolation region (as an N-type isolation well NWI2 shown in FIG. 2C) of the low-side switch 222. The adjustment level ADJ is switched between a reverse recovery level and an anti-latch-up level. The reverse recovery level is lower than the input voltage Vin. The anti-latch-up level is higher than the reverse recovery level, to prevent a latch-up effect from occurring in the parasitic transistors of the high-side switch 221 and the low-side switch 222.

FIG. 2C shows a schematic diagram of a cross-section view of the high-side switch 221 and the low-side switch 222. As shown in FIGS. 2A and 2C, the high-side switch 221 includes a main switch UPT, and further includes a parasitic diode UD and a parasitic transistor UT. The low-side switch 222 includes a main switch LPT, and further includes a parasitic diode LD and a parasitic transistor LT. The parasitic transistor UT is a PNP transistor, and the parasitic transistor LT is an NPN transistor. The semiconductor structure of the main switch UPT, the parasitic diode UD, the parasitic transistor UT, the main switch LPT, the parasitic diode LD, and the parasitic transistor LT are shown in FIG. 2C, and the circuit structure of the main switch UPT, the parasitic diode UD, the parasitic transistor UT, the main switch LPT, the parasitic diode LD, and the parasitic transistor LT are shown in FIG. 2A.

FIG. 2B shows a schematic diagram of signal waveforms of the switching regulator 20 when the load circuit 14 is the light load condition wherein the inductor current IL rings around zero current level (0 A).

As shown in FIG. 2B and also referring to FIG. 2A, in order to ensure that the ON-time of the high-side switch 221 and the ON-time of the low-side switch 222 do not overlap with each other, after the high-side signal UG transits from the high-side high level UGH (active level when the high-side switch 221 includes an N-type transistor) to the high-side low level UGL (inactive level when the high-side switch 221 includes an N-type transistor), there is a dead time DT1 before the low-side signal LG transits from the low-side low level LGL (inactive level when the high-side switch 222 includes an N-type transistor) to the low-side high level LGH (active level when the high-side switch 222 includes an N-type transistor); and after the low-side signal LG transits from the low-side high level UGH to the low-side low level LGL, there is a dead time DT2 before the high-side signal UG transits from the high-side low level UGL to the high-side high level UGH. Note that, the high-side switch 221 is coupled between the input voltage Vin and a phase node PH, and the low-side switch 222 is coupled between the phase node PH and a ground level GND, so the high-side high level UGH and the low-side high level LGH are different voltage levels with reference to the ground level GND, and the high-side low level UGL and the low-side low level LGL are also different voltage levels with reference to the ground level GND.

Still referring FIG. 2B, due to continuity of the current flowing through the inductor, in the first dead time DT1, although the low-side switch 222 is not ON, the parasitic diode LD in the low-side switch 222 is conductive, so the phase node voltage LX of the phase node PH is lower than the ground level GND by a forward voltage of the parasitic diode LD; and in the second dead time DT2, although the high-side switch 221 is not ON, the parasitic diode UD of the high-side switch 221 is conductive, so the phase node voltage LX is higher than the input voltage Vin by a forward voltage of the parasitic diode UD.

FIG. 2C shows a schematic diagram of a cross-section view of the high-side switch 221 and the low-side switch 222. As shown in the figure, the high-side switch 221 and the low-side switch 222 are fully isolated lateral diffused devices, (fully isolated lateral diffused devices are one type of high voltage devices), and the high-side switch 221 and the low-side switch 222 are both N-type high voltage devices. The high-side switch 221 includes: a P-type substrate PSUB, a P-type substrate well PWS1, an N-type deep well DNW1, an N-type isolation well NWI1, a P-type deep well DPW1, a P-type isolation well PWI1, an N-type high voltage well HVNW1, a P-type body region PBODY1, plural isolation structures INS, a drift oxide region DOX, a gate UGT, a source USO, a drain UDR, plural P-type contacts PC, and plural N-type contacts NC. The low-side switch 222 includes: the P-type substrate PSUB, a P-type substrate well PWS2, an N-type deep well DNW2, an N-type isolation well NWI2, a P-type deep well DPW2, a P-type isolation well PWI2, an N-type high voltage well HVNW2, a P-type body region PBODY2, plural isolation structures INS, a drift oxide region DOX, a gate LGT, a source LSO, a drain LDR, plural P-type contacts PC, and plural N-type contacts NC. The high-side switch 221 and the low-side switch 222 are separated by an N-type surrounding isolation well NWIS.

Note that, the term "high voltage" device as used in the context of this invention refers to a device which needs to withstand a voltage over 5V on a drain thereof in normal operation. Typically, the high voltage device has a drift region which separates the drain and the body region of the high voltage device, wherein a lateral length of the drift region (in the embodiment of FIG. 2C, this is the length between the P-type body region PBODY1 and the drain UDR in the N-type high voltage well HVNW1 or the length between the P-type body region PBODY2 and the drain LDR in the N-type high voltage well HVNW2) is determined according to the threshold voltage that the high voltage device is designed to operate by, as well known by those skilled in the art, so details thereof are omitted here.

The P-type substrate PSUB is for example but not limited to a P-type silicon substrate, but certainly it can be a P-type substrate of other types of semiconductor materials. The isolation structure INS for example may be a shallow trench isolation (STI) structure as shown in FIG. 2B, or a local oxidation of silicon (LOCOS) structure. The drift oxide region DOX is formed on the drift region and is in contact with the drift region. The drift oxide region DOX for example may be a chemical vapor deposition (CVD) oxide region as shown in FIG. 2C, or a shallow trench isolation (STI) structure or a local oxidation of silicon (LOCOS) structure.

The P-type substrate well PWS1 (PWS2) has a P-type conductivity, and is formed in a semiconductor layer Sml on the P-type substrate PSUB. The P-type substrate well PWS1 (PWS2) is formed by, for example but not limited to, doping P-type impurities into the semiconductor layer Sml on the P-type substrate PSUB by an ion implantation process step, which implants P-type impurities into the semiconductor layer Sml in the form of accelerated ions. The semiconductor layer Sml may be in the same semiconductor substrate as the P-type substrate PSUB, or an epitaxial layer formed on the P-type substrate PSUB. The P-type substrate wells PWS1 and PWS2 are electrically connected to the P-type substrate PSUB.

The N-type deep well DNW1 (DNW2) is formed in the P-type substrate PSUB, and is located right beneath and in contact with the N-type isolation well NWI1 (NWI2), the P-type deep well DPW1 (DPW2) and the P-type isolation well PWI1 (PWI2). The N-type deep well DNW1 (DNW2) is formed by, for example but not limited to, doping N-type impurities into the P-type substrate PSUB by an ion implantation process step, which implants N-type impurities into the P-type substrate PSUB in the form of accelerated ions.

The N-type isolation well NWI1 (NWI2) is formed in the semiconductor layer Sml on the P-type substrate PSUB. The N-type isolation well NWI1 (NWI2) is formed by, for example but not limited to, doping N-type impurities into the semiconductor layer Sml on the P-type substrate PSUB by an ion implantation process step, which implants N-type impurities into the semiconductor layer Sml in the form of accelerated ions. In a vertical direction perpendicular to the substrate surface plane, the N-type isolation well NWI1 (NWI2) is located on the N-type deep well DNW1 (DNW2), and the N-type isolation well NWI1 (NWI2) is in contact with and electrically connected to the N-type deep well DNW1 (DNW2) to form a closed region in the semiconductor layer Sml, such that the P-type deep well DPW1 (DPW2), the P-type isolation well PWI1 (PWI2), and the N-type high voltage well HVNW1 (HVNW2) and the P-type body region PBODY1 (PBODY2) are all enclosed in the closed region.

The P-type deep well DPW1 (DPW2) is formed in the semiconductor layer Sml on the N-type deep well DNW1 (DNW2), and is located right beneath and in contact with the N-type high voltage well HVNW1 (HVNW2) and the P-type body region PBODY1 (PBODY2). The P-type deep well DPW1 (DPW2) is formed by, for example but not limited to, doping P-type impurities into the semiconductor layer Sml by an ion implantation process step, which implants P-type impurities into the semiconductor layer Sml in the form of accelerated ions.

The P-type isolation well PWI1 (PWI2) is formed in the semiconductor layer Sml on the N-type deep well DNW1 (DNW2). The P-type isolation well PWI1 (PWI2) is formed by, for example but not limited to, doping P-type impurities into the semiconductor layer Sml on the N-type deep well DNW1 (DNW2) by an ion implantation process step, which implants P-type impurities into the semiconductor layer Sml in the form of accelerated ions. In the vertical direction, the P-type isolation well PWI1 (PWI2) is located on the N-type deep well DNW1 (DNW2), and is in contact with the N-type deep well DNW1 (DNW2). In a lateral direction perpendicular to the vertical direction, the P-type isolation well PWI1 (PWI2) is in contact with and electrically connected to the P-type deep well DPW1 (DPW2). The P-type isolation well PWI1 (PWI2) and the P-type deep well DPW1 (DPW2) form another closed region in the semiconductor layer Sml, such that the N-type high voltage well HVNW1 (HVNW2) and the P-type body region PBODY1 (PBODY2) are all enclosed in the closed region.

The P-type body region PBODY1 (PBODY2) has the P-type conductivity, and is formed in the semiconductor layer Sml on the P-type deep well DPW1 (DPW2). The P-type body region PBODY1 (PBODY2) is formed by, for example but not limited to, doping P-type impurities into the semiconductor layer Sml by anion implantation process step, which implants P-type impurities into the semiconductor layer Sml in the form of accelerated ions. In the vertical direction, the P-type body region PBODY1 (PBODY2) is located beneath and in contact with an upper surface of the semiconductor layer Sml.

The N-type high voltage well HVNW1 (HVNW2) is formed in the semiconductor layer Sml on the P-type deep well DPW1 (DPW2). The N-type high voltage well HVNW1 (HVNW2) is formed by, for example but not limited to, doping N-type impurities into the semiconductor layer Sml by an ion implantation process step, which implants N-type impurities into the semiconductor layer Sml in the form of accelerated ions. In the vertical direction, the N-type high voltage well HVNW1 (HVNW2) is located beneath and in contact with an upper surface of the semiconductor layer Sml. The P-type body region PBODY1 (PBODY2) is in contact with the N-type high voltage well HVNW1 (HVNW2) in the lateral direction.

The gate UGT (LGT) is formed on the aforementioned upper surface of the semiconductor layer Sml. In the vertical direction, a part of the body region PBODY1 (PBODY2) and at least a part of the drift oxide region DOX are located beneath and in contact with the gate UGT (LGT). The gate UGT (LGT) includes a dielectric layer, a conductive layer, and a spacer layer. The dielectric layer is formed on and in contact with the upper surface. In the vertical direction, the dielectric layer is in contact with the body region PBODY1 (PBODY2). The conductive layer is formed on and in contact with the dielectric layer, and it includes a conductive material so as to form an electrical contact of the gate UGT (LGT). The spacer layer is formed outside and in contact with two side walls of the conductive layer, enclosing the side walls of the conductive layer. The spacer layer includes an insulating material, to function as an electrically insulation layer enclosing the side walls.

Still referring to FIG. 2C, the source USO (LSO) and the drain UDR (LDR) have the N-type conductivity. The source USO (LSO) and the drain UDR (LDR) are formed beneath the upper surface and in contact with the upper surface in the vertical direction, and the source USO (LSO) and the drain UDR (LDR) are located below and outside the gate UGT (LGT) and at different sides of the gate UGT (LGT), wherein the source USO (LSO) is located in the body region PBODY1 (PBODY2), and the drain UDR (LDR) is located in the high voltage well HVNW1 (HVNW2) which is at a different side of the gate opposite to the source in the lateral direction. In the lateral direction, an inversion region is located between the source USO (LSO) and the high voltage well HVNW1 (HVNW2) in the body region PBODY1 (PBODY2), and is in contact with the upper surface, wherein the inversion region is for providing an inversion current channel in an ON operation of the high-side switch 221 (low-side switch 222). The drift region is located between the drain UDR (LDR) and the body region PBODY1 (PBODY2) in the lateral direction, and is in contact with the upper surface in the high voltage well HVNW1 (HVNW2), to serve as a drift current channel of the high-side switch 221 (low-side switch 222) during ON operation.

Still referring to FIG. 2C, plural P-type contacts PC are formed in the P-type substrate well PWS1 (PWS2), the P-type isolation well PWI1 (PWI2), and the P-type body region PBODY1 (PBODY2), respectively, as electrical contacts of the aforementioned P-type regions. Plural N-type contacts NC are formed in the N-type isolation well NWI1 (NWI2), N-type high voltage well HVNW1 (HVNW2), and the N-type surrounding isolation well NWIS, respectively, as electrical contacts of the aforementioned N-type regions. The N-type surrounding isolation well NWIS is formed between the high-side switch 221 and the low-side switch 222, for separating the high-side switch 221 and the low-side switch 222.

As well known by a person having ordinary skill in the art, when the high-side switch 221 (low-side switch 222) operates in the ON operation, due to a voltage applied to the gate UGT (LGT), an inversion layer is formed beneath the gate UGT (LGT) so that a conduction current flows through a region of the inversion layer that is located between the source USO (LSO) and the drift current channel, which is referred to as the "inversion current channel". Because this is well known to a person having ordinary skill in the art, the details thereof are not redundantly explained here.

It is also well known to a person having ordinary skill in the art that, when the high-side switch 221 (low-side switch 222) operates in the ON operation, the conduction current flows in a drifting manner in the drift region. The "drift region" and the "drift current channel" are well known to a person having ordinary skill in the art, so the details thereof are not redundantly explained here.

The present invention is advantageous over the prior art in several aspects. According to the present invention, in a reverse recovery time RT after the parasitic diode LD transits from conductive status (ON) to nonconductive status (OFF), i.e., for example in the reverse recovery time RT right after a first dead time DT1 (referring to FIG. 2B), the adjustment level is switched to the reverse recovery level ARR, which reduces the reverse recovery time RT of the parasitic diode LD in comparison to the prior art. In addition, in a period when the parasitic transistor UT of the high-side switch 221 and the parasitic transistor LT of the low-side switch 222 are both ON and the latch-up effect occurs in the prior art, according to the present invention, the adjustment level is switched to the anti-latch-up level ALU, to avoid the latch-up effect.

In the first dead time DT1, the parasitic diode LD in the low-side switch 222 is ON, and when the low-side signal LG transits from the low-side low level LGL to the low-side high level LGH after the first dead time DT1, the parasitic diode LD is not immediately turned OFF because the parasitic diode LD requires the reverse recovery time RT to transit from ON to OFF. The present invention reduces the reverse recovery time RT by reducing an electrical level of the isolation region (the N-type isolation well NWI2 in the embodiment of FIG. 2C) of the low-side switch 222 to the reverse recovery level ARR, which is for example but not limited to the ground level GND or the low-side low level LGL. Thus, the present invention reduces the reverse recovery time RT as compared to the prior art.

That is, after the low-side signal LG transits from the low-side low level LGL to the low-side high level LGH, in the reverse recovery time RT, the adjustment signal generation circuit 213 switches the adjustment level ADJ to the reverse recovery level ARR which is lower than the input voltage Vin, wherein the adjustment level ADJ (at the reverse recovery level ARR) is electrically connected to the isolation region (i.e. the N-type isolation well NWI2 in the embodiment of FIG. 2C) of the low-side switch 222, to reduce the reverse recovery time RT. The reverse recovery time RT can be reduced as compared to the prior art, as long as the reverse recovery level ARR is at any level lower than the input voltage Vin. For example, the reverse recovery level ARR may be the ground GND, the low-side low level LGL, or a predetermined level lower than the input voltage Vin.

More specifically, the term "reverse recovery time" refers to a period starting from when a diode is in conductive status (ON) to when the diode is in completely nonconductive status (OFF). In general, a diode cannot be completely turned OFF immediately from the ON status, and there is still a reverse current flowing through the diode for a while. A larger reverse current results in a higher power loss and a longer switching time, which adversely impacts the switching efficiency of the low-side switch 222. Therefore, to reduce the reverse recovery time RT of the low-side switch 222, in one embodiment, the present invention switches the adjustment level ADJ to the reverse recovery level ARR which is lower than the input voltage Vin in the reverse recovery time RT after the low-side signal LG transits from the low-side low level LGL to the low-side high level LGH, wherein the adjustment level ADJ is electrically connected to the isolation region (i.e. the N-type isolation well NWI2 in the embodiment of FIG. 2C) of the low-side switch 222, such that the reverse recovery time RT is reduced in comparison to the prior art. In a preferable embodiment, the reverse recovery level ARR is for example but not limited to the ground level GND or the low-side low level LGL.

On the other hand, when the inductor current IL is lower than the zero current level, and the parasitic diode UD of the high-side switch 121 is ON (for example in the second dead time DT2 as shown in FIG. 2B), if the level of the emitter of the parasitic transistor LT of the low-side switch 222 is electrically connected to the ground level GND or the low-side low level LGL, the parasitic transistor UT of the high-side switch 221 and the parasitic transistor LT of the low-side switch 222 will be ON at the same time, to cause a latch-up effect which may damage the power stage circuit 22. To avoid the latch-up effect, the adjustment signal generation circuit 213 switches the adjustment level ADJ to the anti-latch-up level ALU in the second dead time DT2, wherein the adjustment level ADJ (at the anti-latch-up level ALU) is electrically connected to the isolation region (i.e. the N-type isolation well NWI2 in the embodiment of FIG. 2C) of the low-side switch 222; the anti-latch-up level ALU is higher than the aforementioned reverse recovery level ARR. In a preferable embodiment, the anti-latch-up level ALU is for example but not limited to the low-side high level LGH, the high-side high level UGH, the input voltage Vin, or the phase node voltage LX. The anti-latch-up level ALU is for preventing the parasitic transistor LT of the low-side switch from being turned ON, so as to avoid the latch-up effect.

In brief, the adjustment signal generation circuit 213 switches the adjustment level ADJ to the reverse recovery level ARR and the anti-latch-up level ALU at proper timings. The reverse recovery level ARR is lower than the input voltage Vin, and the anti-latch-up level ALU is higher than the reverse recovery level ARR, and the anti-latch-up level ALU avoids the latch-up effect in the parasitic transistors UT and LT of the high-side switch 221 and the low-side switch 222 respectively. The anti-latch-up level ALU can be any level which is higher than the reverse recovery level ARR and can avoid the latch-up effect.

Figure 4A:
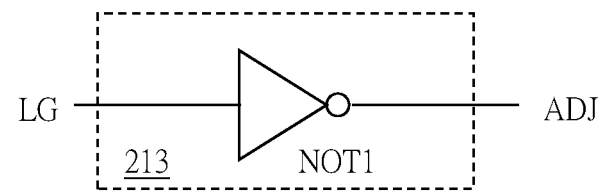
FIGS. 4A-4C show a second embodiment of the present invention.
Figure 4B:
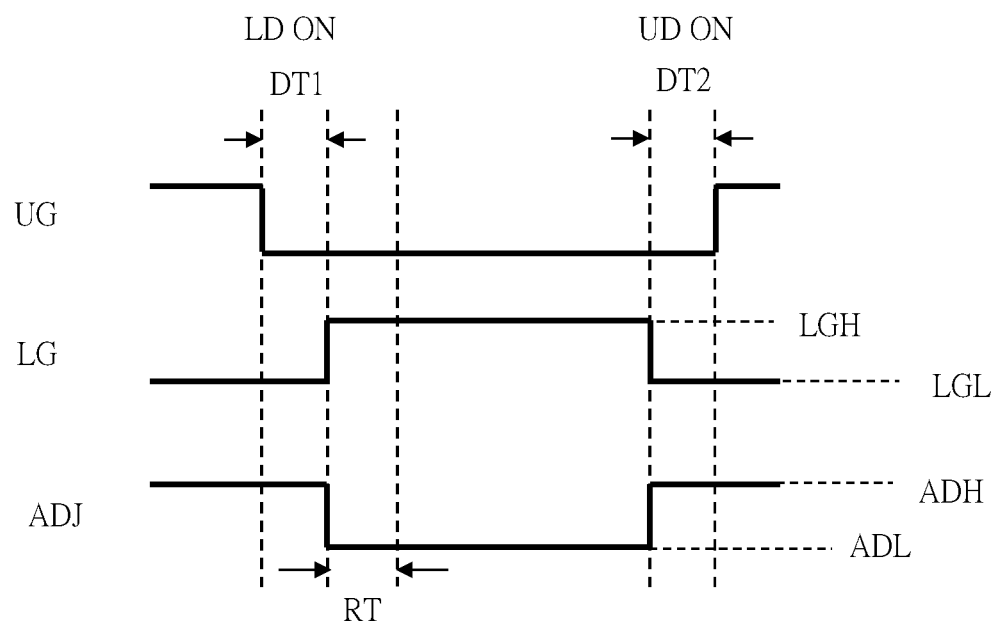
Figure 4C:
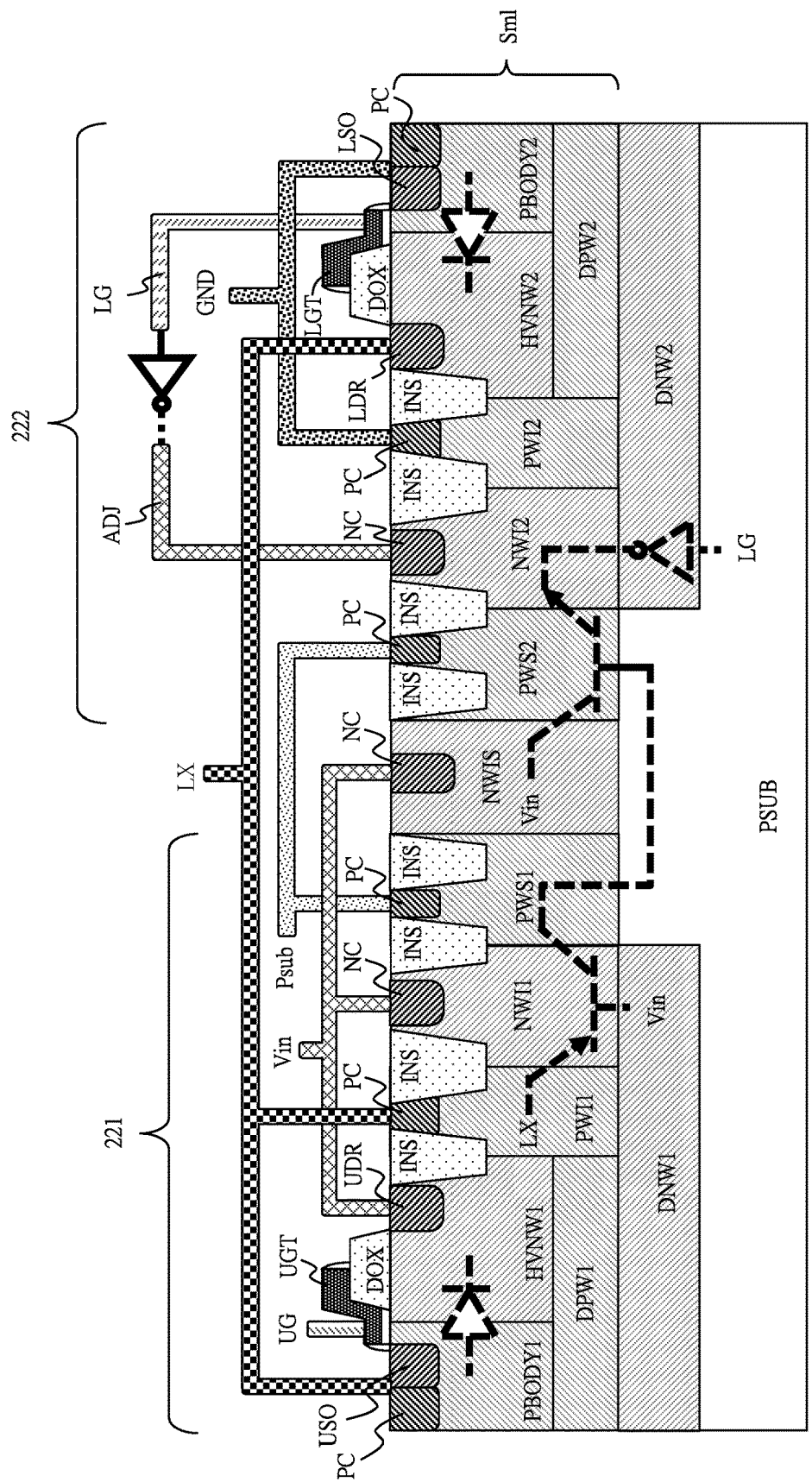

FIGS. 4A-4C show a second embodiment of the present invention. This embodiment shows a more specific embodiment of the adjustment signal generation circuit 213. As shown in FIG. 4A, the adjustment signal generation circuit 213 includes for example but not limited to a logic circuit which generates the adjustment level ADJ which is inverse to the low-side signal LG. As shown in FIG. 4A, the logic circuit for example includes a NOT gate NOT1, which receives the low-side signal LG and generates the adjustment level ADJ which is inverse to the low-side signal LG. As shown in FIG. 4B, the adjustment level ADJ is inverse to the low-side signal LG, and therefore, in the reverse recovery time RT right after the first dead time DT1, the adjustment level ADJ is at the reverse recovery level (the adjustment low level ADL in this embodiment), to reduce the reverse recovery time RT of the parasitic diode LD; and in the second dead time DT2, the adjustment level ADJ is at the anti-latch-up level (the adjustment high level ADH in this embodiment), to avoid the latch-up effect, wherein the adjustment low level ADL is lower than the input voltage Vin, and the adjustment high level ADH is higher than the adjustment low level ADL.

Note that, that the adjustment level ADJ is "inverse" to the low-side signal LG, which means that, first, when the low-side signal LG is at the low-side high level LGH, the adjustment level ADJ is at the adjustment low level ADL, but it does not require for the adjustment low level ADL to be at a same level as the low-side low level LGL, as long as the adjustment low level ADL is low enough to reduce the reverse recovery time RT as compared to the prior art; and second, when the low-side signal LG is at the low-side low level LGL, the adjustment level ADJ is at the adjustment high level ADH, but it does not require for the adjustment high level ADH to be at a same level as the low-side high level LGH, as long as the adjustment low level ADL is high enough to avoid the latch-up effect.

FIG. 4C shows a schematic diagram of a cross-section view of the high-side switch 221 and the low-side switch 222. As shown in the figure, the adjustment level ADJ is inverse to the low-side signal LG, and the adjustment level ADJ is electrically connected to the isolation region (i.e. the N-type isolation well NWI2 in the embodiment of FIG. 4C) of the low-side switch 222.

Figure 5A:
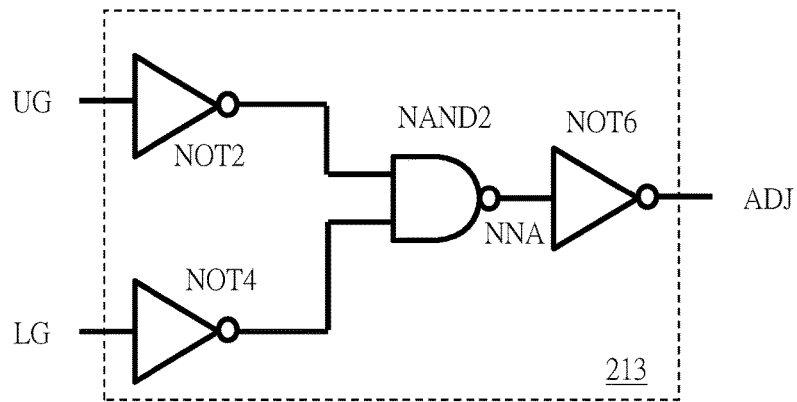
FIGS. 5A-5B show a third embodiment of the present invention.
Figure 5B:
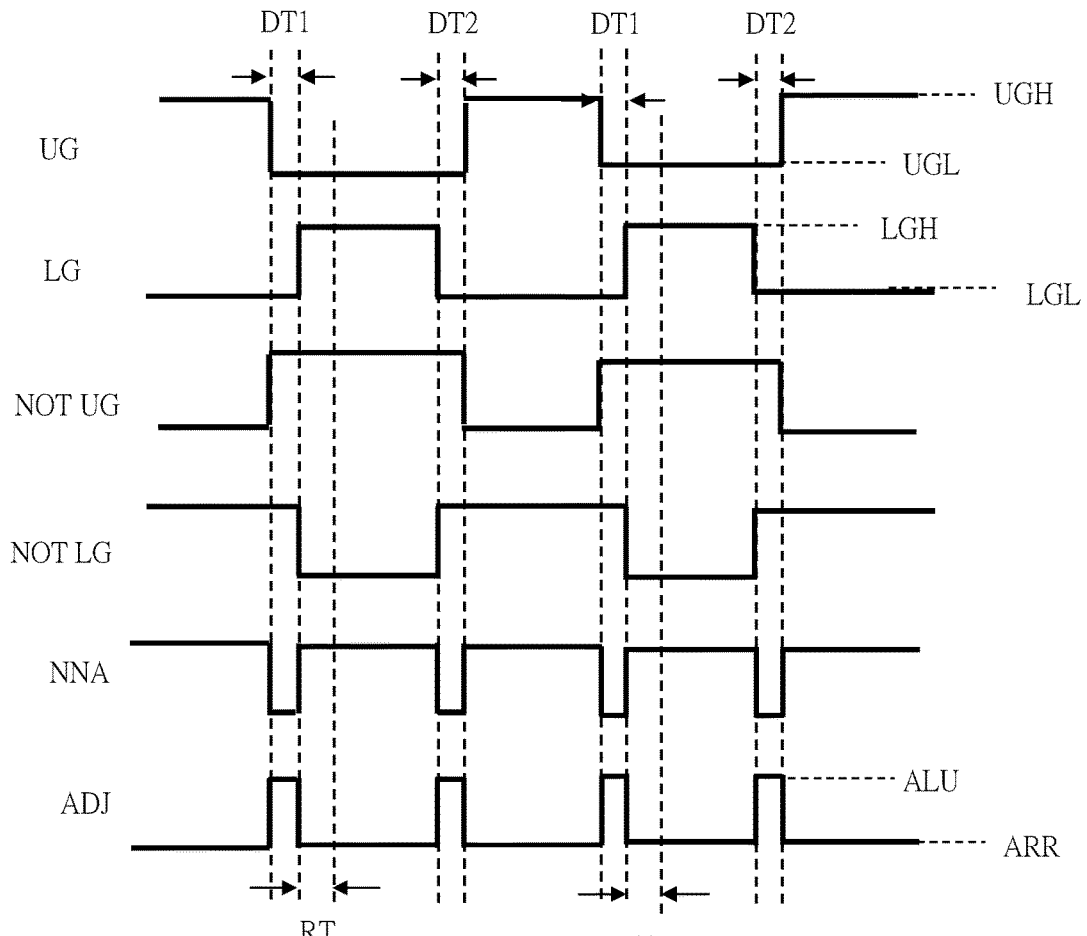

FIGS. 5A-5B show a third embodiment of the present invention. This embodiment shows another more specific embodiment of the adjustment signal generation circuit 213. As shown in FIG. 5A, the adjustment signal generation circuit 213 includes for example but not limited to a logic circuit which generates the adjustment level ADJ according to the high-side signal UG and the low-side signal LG, wherein the adjustment level ADJ is at the anti-latch-up level ALU in the first dead time DT1 and the second dead time DT2, and is at the reverse recovery level ARR in periods other than the first dead time DT1 and the second dead time DT2. In this embodiment, the adjustment level ADJ is at the reverse recovery level ARR in all the other periods except the first dead time DT1 and the second dead time DT2 (in normal operation).

As shown in FIG. 5A, the adjustment signal generation circuit 213 for example includes NOT gate NOT2, NOT gate NOT4, NAND gate NAND2, and NOT gate NOT6. As shown in the figure, NOT gates NOT2 and NOT4 receive the high-side signal UG and the low-side signal LG respectively, and perform NOT logic operations on the high-side signal UG and the low-side signal LG respectively; the results of the NOT logic operations are inputted to the NAND gate NAND2. The NAND gate NAND2 performs NAND logic operation on the results of the NOT logic operations, to generate the adjustment level ADJ having a signal waveform shown in FIG. 5B.

This embodiment is one of many possible embodiments of the adjustment signal generation circuit 213, to realize that the adjustment level ADJ is at the anti-latch-up level ALU in the first dead time DT1 and the second dead time DT2, and is at the reverse recovery level ARR in all the other periods except the first dead time DT1 and the second dead time DT2, wherein the anti-latch-up level ALU is higher than the reverse recovery level ARR. In other embodiments, for example, the results of logic operations on the high-side signal UG and the low-side signal LG may be adjusted by a level shifter circuit to generate the adjustment level ADJ; or, the high-side signal UG and the low-side signal LG may be adjusted by a level shifter circuit before the logic operations. The reverse recovery level ARR can reduce the reverse recovery time as compared to the prior art, as long as it is lower than the input voltage Vin; for example it can be the ground level GND or the low-side low level the low-side low level LG. The anti-latch-up level ALU can be, for example but not limited to, the low-side high level LGH, the high-side high level UGH, the input voltage Vin, or the phase node voltage LX. The anti-latch-up level ALU prevents the parasitic transistor LT of the low-side switch 222 from being turned ON, so as to avoid the occurrence of the latch-up effect of the parasitic transistors LT and UT.

Figure 6A:
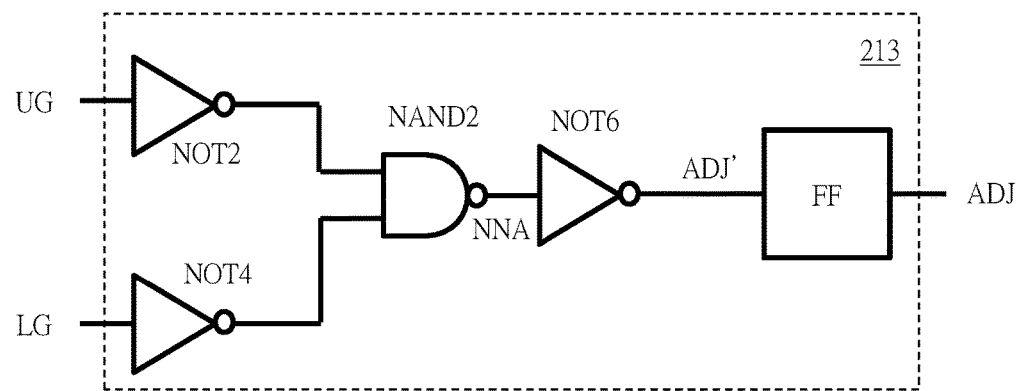
FIGS. 6A-6B show a fourth embodiment of the present invention.
Figure 6B:
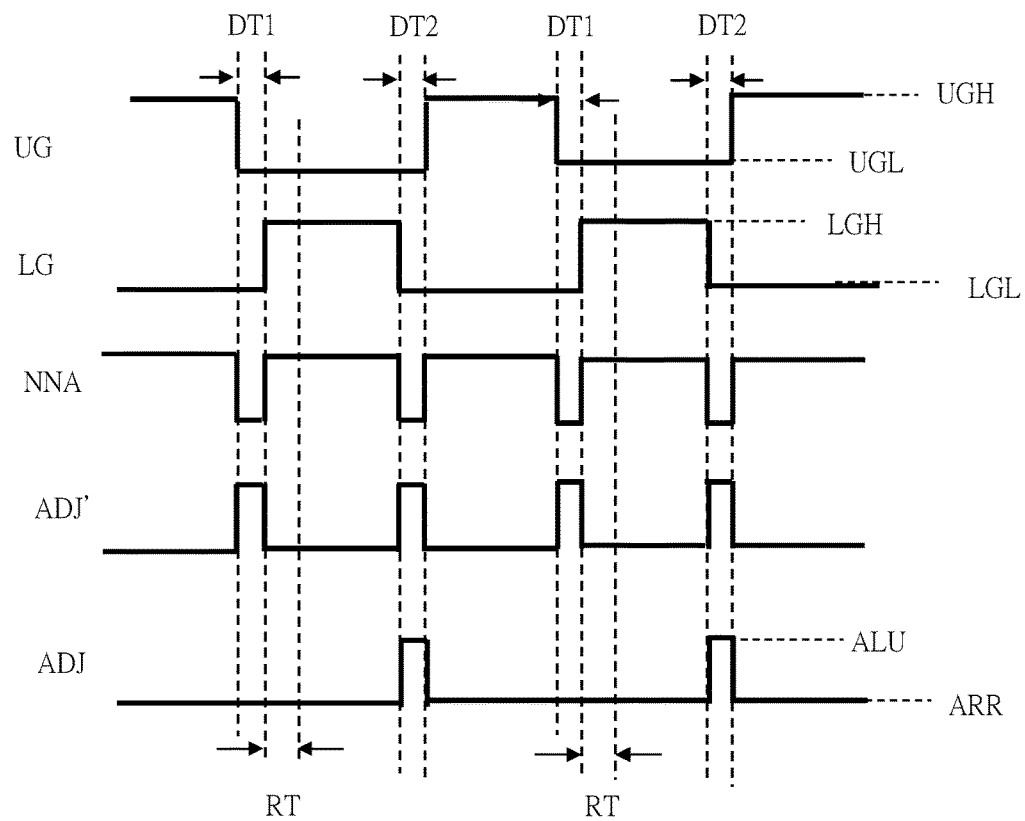

FIGS. 6A-6B show a fourth embodiment of the present invention. This embodiment shows another more specific embodiment of the adjustment signal generation circuit 213. As shown in FIG. 6A, the adjustment signal generation circuit 213 includes for example but not limited to a logic circuit which is similar to the logic circuit shown in FIG. 5A. Compared to the logic circuit shown in FIG. 5A, the logic circuit shown in FIG. 6A further includes a flip-flop circuit FF. The flip-flop circuit FF of this embodiment receives a pre-adjustment level ADJ' (which is the adjustment level ADJ of the third embodiment shown in FIG. 5A). The flip-flop circuit FF switches the adjustment level ADJ to the anti-latch-up level ALU in the second dead time DT2 according to the pre-adjustment level ADJ', and switches the adjustment level ADJ to the reverse recovery level ARR in all the other periods, including the first dead time DT1. A signal waveform of the adjustment level ADJ is shown in FIG. 6B.

Figure 7A:
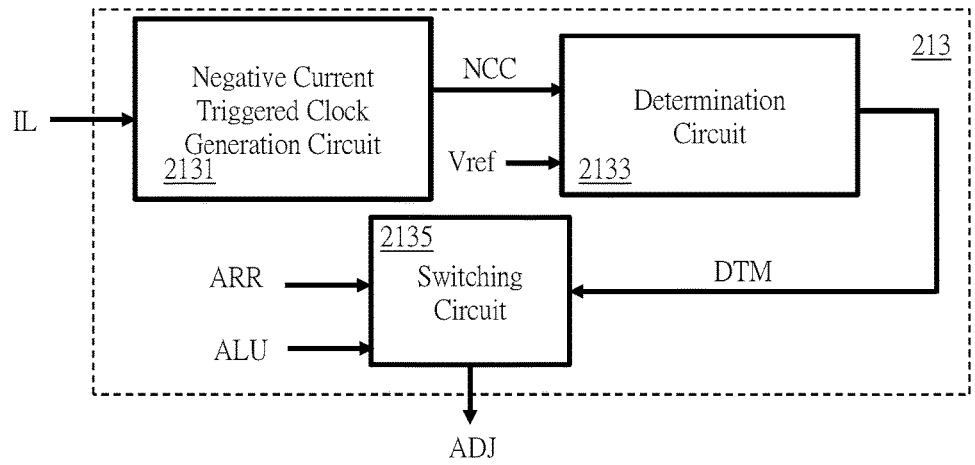
FIGS. 7A-7C show a fifth embodiment of the present invention.
Figure 7B:
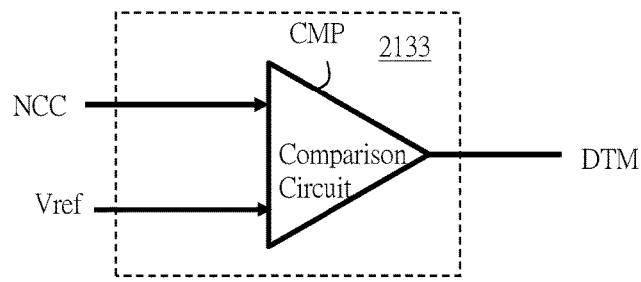
Figure 7C:
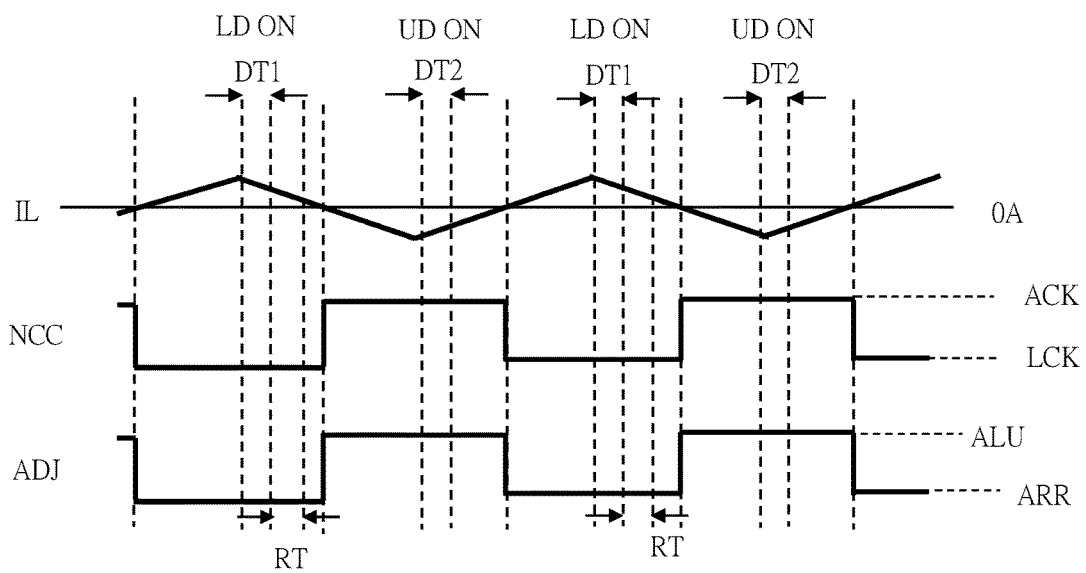

FIGS. 7A-7C show a fifth embodiment of the present invention. This embodiment shows another more specific embodiment of the adjustment signal generation circuit 213. As shown in FIG. 7A, the adjustment signal generation circuit 213 includes for example but not limited to a negative current triggered clock generation circuit 2131, a determination circuit 2133, and a switching circuit 2135. Referring to FIGS. 7A-7C, the negative current triggered clock generation circuit 2131 is configured to operably generate a negative current clock NCC according to the inductor current IL, wherein the negative current clock signal NCC is switched to an acknowledged level ACK when the inductor current IL is a negative current. The determination circuit 2133 is coupled to the negative current triggered clock generation circuit 2131, and is configured to operably generate a determination signal DTM according to the negative current clock signal VCC and a reference signal Vref. The switching circuit 2135 is coupled to the determination circuit 2133, and is configured to operably switch the adjustment level ADJ between the reverse recovery level ARR and the anti-latch-up level ALU according to the determination signal DTM.

In this embodiment, the negative current triggered clock generation circuit 2131 switches the negative current clock signal NCC between the acknowledged level ACK and a relatively low level LCK (relative to the acknowledged level ACK) according to the inductor current IL. For example, when the inductor current IL is a negative current, the negative current triggered clock generation circuit 2131 switches the negative current clock signal NCC to the acknowledged level ACK; and when the inductor current IL is a positive current, the negative current triggered clock generation circuit 2131 switches the negative current clock signal NCC to the relatively low level LCK. When the inductor current IL rings around zero current, the negative current clock signal NCC accordingly switches between the acknowledged level ACK and the relatively low level LCK. The determination circuit 2133 includes, for example but not limited to, a comparison circuit CMP as shown in the figure, which compares the negative current clock signal NCC with the reference Vref, and generates the determination signal DTM according to the comparison result, thereby switching the adjustment level ADJ to the anti-latch-up level ALU when the inductor current IL is a negative current, and switching the adjustment potential ADJ to the reverse recovery level ARR when the inductor current IL is a positive current.

Figure 8A:
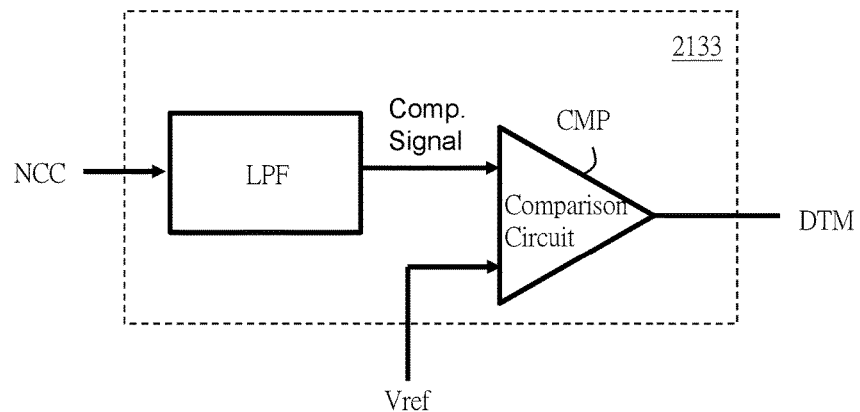
FIGS. 8A-8B show a sixth embodiment of the present invention.
Figure 8B:
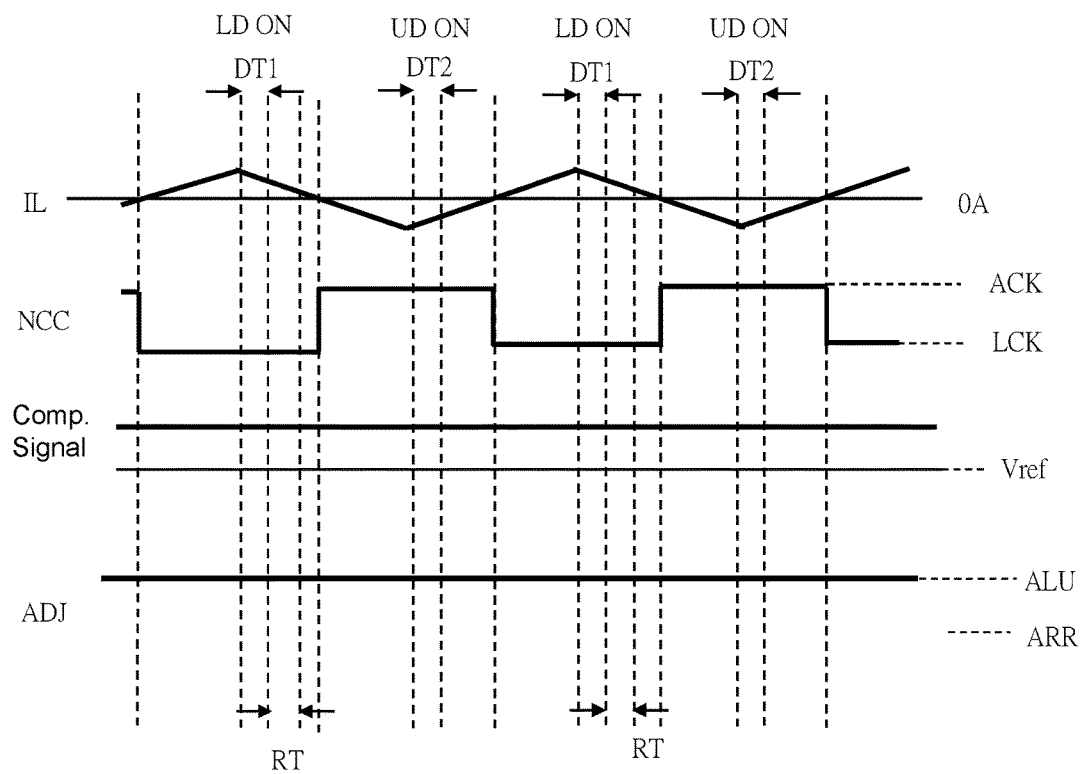

FIGS. 8A-8B show a sixth embodiment of the present invention. This embodiment shows a more specific embodiment of the determination circuit 2133. As shown in FIG. 8A, the determination circuit 2133 includes a low-pass filter LPF and a comparison circuit CMP. The low-pass filter LPF is coupled to the negative current clock generation circuit 2131, and is configured to operably generate a comparison signal according to a duty ratio of the acknowledged level ACK. The comparison circuit CMP is coupled to the low-pass filter LPF, and is configured to operably compare the comparison signal with the reference signal Vref to generate the determination signal DTM. For example, as shown in FIG. 8B, when the inductor current IL rings around zero current, the negative current triggered clock generation circuit 2131 generates the negative current clock signal NCC which switches between the acknowledged level ACK and the relatively low level LCK. The low-pass filter LPF performs a low-pass filtering operation on the negative current clock signal NCC to generate a DC comparison signal. For example, when the duty ratio of the acknowledged level ACK is higher than a predetermined ratio, the DC comparison signal will be higher than the reference signal Vref, and the determination signal DTM is switched to a high level, whereby the adjustment level ADJ is switched to the anti-latch-up level ALU. That is, in this embodiment, when the duty ratio of the acknowledged level ACK is higher than the predetermined ratio, the adjustment level ADJ is switched to the anti-latch-up level ALU; and when the duty ratio of the acknowledged level ACK is not higher than the predetermined ratio, the adjustment level ADJ is switched to the reverse recovery level ARR.

This embodiment indicates that, according to the present invention, it is not strictly required for the adjustment level ADJ to be switched to the reverse recovery level ARR immediately right after the first dead time the dead time DT1, so that in the reverse recovery time RT, the adjustment level ADJ is completely at the reverse recovery level ARR, and not strictly required for the adjustment level ADJ to be completely at the anti-latch-up level ALU in the second dead time DT2. Instead, the adjustment level ADJ may be adaptively switched between the reverse recovery level ARR and the anti-latch-up level ALU according to the duty ratio of the negative current of the inductor current IL.

The present invention has been described in considerable detail with reference to certain preferred embodiments thereof. It should be understood that the description is for illustrative purpose, not for limiting the scope of the present invention. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. Furthermore, those skilled in this art can readily conceive variations and modifications within the spirit of the present invention. As an example, the logic circuits shown in the embodiments are not limited to the NOT gate and the NAND gate as shown, but can be other logic gates for realizing the same functions according to the spirit of the present invention; for example, if the meanings of the high and low levels of a digital signal are interchanged, the logic circuits should be modified correspondingly. As another example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. The spirit of the present invention should cover all such and other modifications and variations, which should be interpreted to fall within the scope of the following claims and their equivalents.

What is claimed is:

1. A switching regulator, configured to operably convert an input voltage to an output voltage, and comprising:
    a power stage circuit including a high-side switch, a low-side switch, and an inductor coupled with one another, the power stage circuit being configured to operably convert the input voltage to the output voltage by operating the high-side switch and the low-side switch according to a high-side signal and a low-side signal respectively, and generate an inductor current flowing through the inductor; and
    a control circuit, which is coupled to the power stage circuit, and includes:
        a switching signal generation circuit, which is coupled to the power stage circuit, and is configured to operably generate the high-side signal and the low-side signal according to a command signal; and
        an adjustment signal generation circuit, which is coupled to the power stage circuit and the switching signal generation circuit, and is configured to operably provide an adjustment level according to the high-side signal, the low-side signal, and/or the inductor current, wherein the adjustment level is electrically connected to an isolation region of the low-side switch;
    wherein the adjustment level is switched between a reverse recovery level and an anti-latch-up level;
    wherein the reverse recovery level is lower than the input voltage;
    wherein the anti-latch-up level is higher than the reverse recovery level to avoid a latch-up effect.

2. The switching regulator of claim 1, wherein the adjustment level is at the reverse recovery level in a reverse recovery time right after a first dead time, and is at the anti-latch-up level in a second dead time, wherein the first dead time is from when the high-side signal transits to a high-side inactive level to when the low-side signal transits to a low-side inactive level, and the second dead time is from when the low-side signal transits to a low-side inactive level to when the high-side signal transits to a high-side active level.

3. The switching regulator of claim 2, wherein the adjustment signal generation circuit includes a logic circuit configured to generate the adjustment level which is inverse to the low-side signal.

4. The switching regulator of claim 2, wherein the adjustment signal generation circuit includes a logic circuit configured to generate the adjustment level according to the high-side signal and the low-side signal, wherein the adjustment level is at the anti-latch-up level in the first dead time and the second dead time, and is at the reverse recovery level in a period other than the first dead time and the second dead time.

5. The switching regulator of claim 1, wherein the adjustment signal generation circuit includes:
a negative current triggered clock generation circuit, configured to operably generate a negative current clock according to the inductor current, wherein the negative current clock signal is switched to an acknowledged level when the inductor current is a negative current;
a determination circuit, which is coupled to the negative current clock generation circuit, and is configured to operably generate a determination signal according to the negative current clock signal and a reference signal; and
a switching circuit, which is coupled to the determination circuit, and is configured to operably switch the adjustment level between the reverse recovery level and the anti-latch-up level according to the determination signal.

6. The switching regulator of claim 5, wherein the determination circuit includes:
a low-pass filter, which is coupled to the negative current triggered clock generation circuit, and is configured to operably generate a comparison signal according to a duty ratio of the acknowledged level; and
a comparison circuit, which is coupled to the low-pass filter, and is configured to operably compare the comparison signal with the reference signal to generate the determination signal.

7. The switching regulator of claim 1, wherein the reverse recovery level is a ground level or a low-side low level of the low-side signal, and the anti-latch-up level is a low-side high level of the low-side signal, a high-side high level of the high-side signal, the input voltage, or a phase voltage at a phase node among the high-side switch, the low-side switch and the inductor.

8. A control circuit of a switching regulator, wherein the switching regulator is configured to operably convert an input voltage to an output voltage, and include: a power stage circuit including a high-side switch, a low-side switch, and an inductor coupled with one another, the power stage circuit being configured to operably convert the input voltage to the output voltage by operating the high-side switch and the low-side switch according to a high-side signal and a low-side signal respectively, and generate an inductor current flowing through the inductor; and the control circuit, which is coupled to the power stage circuit; the control circuit comprising:

a switching signal generation circuit, which is coupled to the power stage circuit, and is configured to operably generate the high-side signal and the low-side signal according to a command signal; and
an adjustment signal generation circuit, which is coupled to the power stage circuit and the switching signal generation circuit, and is configured to operably provide an adjustment level according to the high-side signal, the low-side signal, and/or the inductor current, wherein the adjustment level is electrically connected to an isolation region of the low-side switch;
wherein the adjustment level is switched between a reverse recovery level and an anti-latch-up level;
wherein the reverse recovery level is lower than the input voltage;
wherein the anti-latch-up level is higher than the reverse recovery level to avoid a latch-up effect.

9. The control circuit of claim 8, wherein the adjustment level is at the reverse recovery level in a reverse recovery time right after a first dead time, and is at the anti-latch-up level in a second dead time, wherein the first dead time is from when the high-side signal transits to a high-side inactive level to when the low-side signal transits to a low-side inactive level, and the second dead time is from when the low-side signal transits to a low-side inactive level to when the high-side signal transits to a high-side active level.

10. The control circuit of claim 9, wherein the adjustment signal generation circuit includes a logic circuit configured to generate the adjustment level which is inverse to the low-side signal.

11. The control circuit of claim 9, wherein the adjustment signal generation circuit includes a logic circuit configured to generate the adjustment level according to the high-side signal and the low-side signal, wherein the adjustment level is at the anti-latch-up level in the first dead time and the second dead time, and is at the reverse recovery level in a period other than the first dead time and the second dead time.

12. The control circuit of claim 8, wherein the adjustment signal generation circuit includes:
a negative current triggered clock generation circuit, configured to operably generate a negative current clock according to the inductor current, wherein the negative current clock signal is switched to an acknowledged level when the inductor current is a negative current;
a determination circuit, which is coupled to the negative current clock generation circuit, and is configured to operably generate a determination signal according to the negative current clock signal and a reference signal; and
a switching circuit, which is coupled to the determination circuit, and is configured to operably switch the adjustment level between the reverse recovery level and the anti-latch-up level according to the determination signal.

13. The control circuit of claim 12, wherein the determination circuit includes:
a low-pass filter, which is coupled to the negative current triggered clock generation circuit, and is configured to operably generate a comparison signal according to a duty ratio of the acknowledged level; and
a comparison circuit, which is coupled to the low-pass filter, and is configured to operably generate the determination signal according to the comparison signal and the reference signal.

14. The control circuit of claim 8, wherein the reverse recovery level is a ground level or a low-side low level of the low-side signal, and the anti-latch-up level is a low-side high level of the low-side signal, a high-side high level of the high-side signal, the input voltage, or a phase voltage at a phase node among the high-side switch, the low-side switch and the inductor.

15. A control method of a switching regulator, comprising:
generating a high-side signal and a low-side signal according to a command signal;
operating a high-side switch and a low-side switch in a power stage circuit according to a high-side signal and a low-side signal respectively to convert an input voltage to an output voltage, and generating an inductor current flowing through an inductor in the power stage circuit, wherein the high-side switch, the low-side switch, and the inductor are coupled with one another; and
providing an adjustment level according to the high-side signal, the low-side signal, and/or the inductor current, wherein the adjustment level is electrically connected to an isolation region of the low-side switch;
wherein the adjustment level is switched between a reverse recovery level and an anti-latch-up level;
wherein the reverse recovery level is lower than the input voltage;
wherein the anti-latch-up level is higher than the reverse recovery level to avoid a latch-up effect.

16. The control method of claim 15, wherein the adjustment level is at the reverse recovery level in a reverse recovery time right after a first dead time, and is at the anti-latch-up level in a second dead time, wherein the first dead time is from when the high-side signal transits to a high-side inactive level to when the low-side signal transits to a low-side inactive level, and the second dead time is from when the low-side signal transits to a low-side inactive level to when the high-side signal transits to a high-side active level.

17. The control method of claim 16, wherein the step of generating the adjustment signal includes: generating the adjustment level which is inverse to the low-side signal by a logic circuit.

18. The control method of claim 16, wherein the step of generating the adjustment signal includes: generating the adjustment level according to the high-side signal and the low-side signal by a logic circuit, wherein the adjustment level is at the anti-latch-up level in the first dead time and the second dead time, and is at the reverse recovery level in a period other than the first dead time and the second dead time.

19. The control method of claim 15, wherein the step of generating the adjustment signal includes:
generating a negative current clock signal according to the inductor current, wherein the negative current clock signal is switched to an acknowledged level when the inductor current is a negative current;
generating a determination signal according to the negative current clock signal and a reference signal; and
switching the adjustment level between the reverse recovery level and the anti-latch-up level according to the determination signal.

20. The control method of claim 19, wherein the step of generating the determination signal includes:
generating a comparison signal according to a duty ratio of the acknowledged level; and
comparing the comparison signal and the reference signal to generate the determination signal.

21. The control method of claim 15, wherein the reverse recovery level is a ground level or a low-side low level of the low-side signal, and the anti-latch-up level is a low-side high level of the low-side signal, a high-side high level of the high-side signal, the input voltage, or a phase voltage at a phase node among the high-side switch, the low-side switch and the inductor.

* * * * *